United States Patent
Choi et al.

(10) Patent No.: US 7,326,605 B2
(45) Date of Patent: Feb. 5, 2008

(54) SEMICONDUCTOR CARBON NANOTUBES FABRICATED BY HYDROGEN FUNCTIONALIZATION AND METHOD FOR FABRICATING THE SAME

(75) Inventors: Won-bong Choi, Yongin (KR); Young-hee Lee, Suwon (KR)

(73) Assignee: Samsung Electronics Co., Ltd., Suwon, Kyungki-do (KR)

( * ) Notice: Subject to any disclaimer, the term of this patent is extended or adjusted under 35 U.S.C. 154(b) by 0 days.

(21) Appl. No.: 11/327,368

(22) Filed: Jan. 9, 2006

(65) Prior Publication Data
US 2006/0237708 A1 Oct. 26, 2006

Related U.S. Application Data

(62) Division of application No. 10/428,835, filed on May 5, 2003, now abandoned.

(30) Foreign Application Priority Data

May 3, 2002 (KR) .............................. 2002-24476

(51) Int. Cl.
*H01L 21/336* (2006.01)
(52) U.S. Cl. ..................... 438/197; 257/E39
(58) Field of Classification Search ................ 438/197; 257/E39
See application file for complete search history.

(56) References Cited

U.S. PATENT DOCUMENTS 6,538,262 B1 3/2003 Crespi et al.

| | | |
|---|---|---|
| 2002/0006489 A1 | 1/2002 | Goto et al. |
| 2002/0127171 A1* | 9/2002 | Smalley et al. .......... 423/447.6 |
| 2003/0044519 A1 | 3/2003 | Takai |
| 2004/0099438 A1* | 5/2004 | Arthur et al. ................ 174/257 |

FOREIGN PATENT DOCUMENTS

JP 2002-25425 1/2002

OTHER PUBLICATIONS

Kim, et al., "Modification of Electronic Structures of a Carbon Nanotube by Hydrogen Functionalization", Advanced Materials, 24(14):1818-1821 (Dec. 17, 2002).

(Continued)

*Primary Examiner*—Long Pham
(74) *Attorney, Agent, or Firm*—Lee & Morse, P.C.

(57) ABSTRACT

Semiconductor carbon nanotubes functionalized by hydrogen and a method for fabricating the same, wherein the functional hydrogenated semiconductor carbon nanotubes have chemical bonds between carbon and hydrogen atoms. The semiconductor carbon nanotube fabricating method includes heating carbon nanotubes in a vacuum, dissociating hydrogen molecules in hydrogen gas into hydrogen atoms, and exposing the carbon nanotubes to the hydrogen gas to form chemical bonds between carbon atoms of the carbon nanotubes and the hydrogen atoms. The conversion of metallic carbon nanotubes into semiconductor nanotubes and of semiconductor nanotubes having a relatively narrow energy bandgap into semiconductor nanotubes having a relative wide energy bandgap can be achieved using the method. The functional hydrogenated semiconductor carbon nanotubes may be applied and used in, for example, electronic devices, optoelectronic devices, and energy storage.

28 Claims, 17 Drawing Sheets

OTHER PUBLICATIONS

Kim, et al., "Band Gap Modulation of a Carbon Nanotube by Hydrogen Functionalization" Journal of the Korean Physical Society, vol. 42, pp. S137-S142, (Feb. 2003).

Pekker, et al., "Hydrogenation of Carbon Nanotubes and Graphite in Liquid Ammonia", J. Phys. Chem. B., vol. 105, pp. 7938-7943 (Jul. 26, 2001).

Khare, et al., "Functionalization of Carbon Nanotubes Using Atomic Hydrogen From a Glow Discharge", Nano Letters, American Chemical Soc., 2(1):73-77 (Jan. 2002).

Mickelson, et al., "Fluorination of Single-Wall Carbon Nanotubes", Chemical Physics Letters, vol. 296, pp. 188-194, (Oct. 30, 1998).

* cited by examiner

SEMICONDUCTOR CARBON NANOTUBES FABRICATED BY HYDROGEN FUNCTIONALIZATION AND METHOD FOR FABRICATING THE SAME

CROSS REFERENCE TO RELATED APPLICATION

This is a divisional application based on application Ser. No. 10/428,835, filed May 5, 2003, now abandoned the entire contents of which is hereby incorporated by reference.

BACKGROUND OF THE INVENTION

1. Field of the Invention

The present invention relates to semiconductor carbon nanotubes functionalized by hydrogen, and more particularly, to a method for fabricating the same.

2. Description of the Related Art

Carbon nanotubes are cylindrical or tubular forms of carbon having diameters ranging from a few to tens of nanometers and lengths of tens of micrometers.

FIG. 1 illustrates the configuration of a conventional carbon nanotube. Carbon nanotubes may be thought of as being formed by rolling up sheets of graphite (a hexagonal lattice of carbon) into cylinders. The unique properties of carbon tubes are determined by the length, configuration and diameter of the carbon tubes as determined by the angle at which a sheet of graphite being rolled is twisted, i.e., chirality, and the diameter of the carbon nanotubes at the initial stage of rolling.

Referring to FIG. 1, vector $\vec{C}_h$ from an arbitrary start point A to an end point A', which meet when the sheet is rolled up, is shown. If it is assumed that A has coordinates (0, 0) and A' has coordinates (n, m), then vector $\vec{C}_h$ can be expressed with unit vectors $\vec{a}_1$ and $\vec{a}_2$ as in equation (1) below.

$$\vec{C}_h = n\vec{a}_1 + m\vec{a}_2 \qquad (1)$$

The diameter $d_t$ of the carbon nanotube can be calculated using equation (2) below.

$$d_t = \frac{0.246(n^2 + nm + m^2)^{1/2}}{\pi} \qquad (2)$$

Carbon nanotubes feature very high aspect ratios of 1,000 or greater and have the electrical properties of a metal or of a semiconductor depending on their diameters and configurations. Metallic carbon nanotubes are known to have high electrical conductance.

FIG. 2A illustrates a special type of a carbon nantotube in zigzag form, which is obtained when m=0. FIG. 2B illustrates a carbon nanotube having an armchair configuration, which is obtained when n=m.

Most carbon nanotubes have chiral configurations spirally arranged along arbitrary tubular axes. Carbon nanotubes formed from a single sheet of graphite rolled up into a cylinder are called "single wall nanotubes" (SWNT), and carbon nanotubes formed from multiple sheets of graphite rolled up into cylinders inside other cylinders are called "multi-wall nanotubes" (MWNT).

Conventionally, carbon nanotubes are manufactured using arc discharging, laser ablation, chemical vapor deposition (CVD), and like processes. Such conventional techniques, however, cannot control chirality, and lead to a mixture of metallic and semiconductor carbon nanotube particles, which cannot be used to manufacture metallic nanotransistors. In addition, transistors manufactured from semiconductor carbon nanotubes do not work at an ambient temperature due to the small energy bandgap of the semiconductor carbon nanotubes.

To overcome such drawbacks, a method has been developed for converting metallic carbon nanotubes into semiconductor carbon nanotubes by separating outer walls of MWNTs to reduce the diameter of the carbon nanotubes. However, this method involves placing the metallic carbon nanotubes in contact with an electrode and applying a high current to them, which renders the overall process to be complex. In addition, the method can be applied neither directly to transistors nor to SWNTs having no extra wall to be separated out.

Another conventional method for converting semiconductor carbon nanotubes into metallic carbon nanotubes by the addition of alkali metal has been suggested. However, this method cannot be applied to convert metallic carbon nanotubes into semiconductor carbon nanotubes nor to convert narrow bandgap semiconductor carbon nanotubes into large bandgap semiconductor carbon nanotubes.

SUMMARY OF THE INVENTION

The present invention provides a semiconductor carbon nanotube that is fabricated by hydrogen functionalization.

The present invention also provides a method for converting a metallic carbon nanotube into a semiconductor carbon nanotube, and for converting a narrow energy bandgap semiconductor carbon nanotube into a wide energy bandgap semiconductor carbon nanotube.

According to a feature of a preferred embodiment of the present invention, there is provided a semiconductor carbon nanotube having chemical bonds between carbon and hydrogen atoms. It is preferred that the chemical bonds between carbon and hydrogen atoms are $sp^3$ hybrid bonds.

According to another feature of another preferred embodiment of the present invention, there is provided a method for fabricating a semiconductor carbon nanotube, the method comprising heating a carbon nanotube in a vacuum, dissociating hydrogen molecules in hydrogen gas into hydrogen atoms, and exposing the carbon nanotube to the hydrogen atoms in the hydrogen gas to form chemical bonds between carbon atoms of the carbon nanotube and hydrogen atoms.

In accordance with an aspect of the present invention, heating of the carbon nanotube in a vacuum may be performed at a temperature of 100° C. or greater for 2 hours or longer.

In accordance with another aspect of the present invention, dissociation of hydrogen molecules into hydrogen atoms may be performed by heating the hydrogen molecules at a temperature of 1500° C. or greater. The dissociation of the hydrogen molecules into the hydrogen atoms may be accomplished by applying an RF or DC bias voltage or using arc discharging.

According to another feature of an embodiment of the present invention, when forming the chemical bonds between the carbon atoms and hydrogen atoms, the energy bandgap of the carbon nanotube may be controlled by varying the length of time the carbon nanotube is exposed to the hydrogen gas containing hydrogen atoms. Alternatively, the energy bandgap of the carbon nanotube may be controlled by varying the level of pressure under which the carbon nanotube is exposed to the hydrogen gas containing hydrogen atoms. The chemical bonds between the carbon and hydrogen atoms in the carbon nanotube fabricated according to an embodiment of the present inventive method may be $sp^3$ hybrid bonds.

According to the present invention, metallic carbon nanotubes can be converted into semiconductor carbon nanotubes, and narrow energy bandgap semiconductor carbon nanotubes can be converted into wide energy bandgap semiconductor carbon nanotubes by hydrogenation. The functional hydrogenated semiconductor carbon nanotubes have a wide range of applications, including use in electronic devices such as transistors, electro-optic devices, energy storage devices, and other electronic devices.

BRIEF DESCRIPTION OF THE DRAWINGS

The above and other features and advantages of the present invention will become more apparent to those of ordinary skill in the art by describing in detail preferred embodiments thereof with reference to the attached drawings in which:

FIG. 9B-1 is a graph of current versus voltage for metallic carbon nanotubes (MS) and semiconductor carbon nanotubes (SS) at 288K after hydrogenation;

FIG. 9B-2 is a graph of current versus voltage for the MS and SS before hydrogenation;

FIG. 9C-1 is a graph plotting a curve for MC showing differential conductance (dI/dV) at 4.2K with respect to source-drain voltage after hydrogenation;

FIG. 9C-2 is a graph plotting a curve for the MC showing differential conductance (dI/dV) at 7.6K with respect to source-drain voltage before hydrogenation;

FIG. 9D-1 is a graph plotting a curve for SS showing differential conductance at 4.2K with respect to source-drain voltage after hydrogenation;

FIG. 9D-2 is a graph plotting a curve for the SS showing differential conductance (dI/dV) at 6.5K with respect to source-drain voltage before hydrogenation;

FIG. 10A shows the configuration of an MS, FIG. 10B shows the configuration of an SS, FIG. 1C shows the energy band of the MS shown in FIG. 10A, and FIG. 10D shows the energy band of the SS shown in FIG. 10B;

FIG. 11A shows the configuration of one SS, FIG. 11B shows the configuration of another SS, FIG. 11C shows the energy level of the SS shown in FIG. 11A having a narrow energy bandgap, and FIG. 11D shows the energy level of the SS shown in FIG. 11B having a relatively wide energy bandgap.

FIG. 14B-1 is a graph plotting a curve of current versus voltage for metallic and semiconductor carbon nanotubes having a narrow bandgap after hydrogenation;

FIG. 14B-2 is an enlarged graph of a portion of the graph of FIG. 14B-1 in which $V_{sd}$ varies from −0.5V to +0.5V;

DETAILED DESCRIPTION OF THE INVENTION

Korean Patent Application No. 2002-24476, filed on May 3, 2002, and entitled "Semiconductor Carbon Nanotubes Fabricated by Hydrogen Functionalization and Method for Fabricating the Same," is incorporated by reference herein in its entirety.

Embodiments of carbon nanotubes with hydrogen and a method for fabricating the same according to the present invention will now be described with reference to the accompanying drawings, in which preferred embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art.

Figure 3:
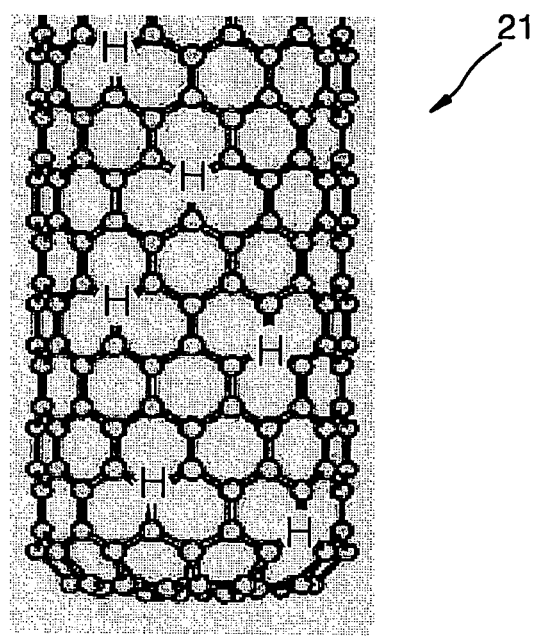
FIG. 3 illustrates a functional hydrogenated carbon nanotube according to an embodiment of the present invention.

FIG. 3 illustrates a carbon nanotube according to an embodiment of the present invention. Referring to FIG. 3, a carbon nanotube 21 according to an embodiment of the present invention has C—H chemical bonds formed by binding hydrogen atoms to dangling bonds on the surface of the carbon nanotube.

The carbon nanotube 21 can be manufactured using, for example, arc discharge, laser vaporization, plasma enhanced chemical vapor deposition (PECVD), thermal chemical vapor deposition, vapor phase growth, and the like.

Carbon nanotubes according to the present invention have chemical bonds between their carbon atoms and hydrogen atoms, in which $sp^3$ hybrid bonding is promoted while $sp^2$ hybrid bonding is suppressed to take energy away from the Fermi level electrons, thereby imparting semiconductor properties to the carbon nanotubes.

Carbon atoms, whose atomic number is 6, have an electron configuration of $1s^22s^22p^2$ in the ground state. However, the electron configuration of carbon is converted when covalently bonded to another atom. In other words, after one of the electrons in the 2s orbital is promoted to the 2p orbital, the 2s orbital and the 2p orbital are combined to give sp hybrid orbitals.

An sp hybrid orbital is formed from one s orbital and one p orbital with electrons, three $sp^2$ hybrid orbitals are formed from one s orbital and two p orbitals with electrons, and four $sp^3$ hybrid orbitals are formed from one s orbital and three p orbitals with electrons.

The electron configuration of carbon atoms enabling them to form a crystalline structure on their own includes $sp^3$ and $sp^2$ configurations. The $sp^3$ configuration with four hybrid orbitals permits carbon atoms to form four strong σ bonds. The $sp^2$ configuration with three hybrid orbitals permits carbon atoms to form three σ bonds in a plane, which are weaker than those in the $sp^3$ configuration. The $sp^2$ configuration also permits the electrons in the p orbitals to form weak π bonds.

Carbon nanotubes according to the present invention are synthesized by forming C—H chemical bonds through the addition of hydrogen into carbon nanotubes having the $sp^3$ and $sp^2$ electron configurations, in which π or π* bonds near the Fermi level in the $sp^2$ hybrid orbitals are cleaved, so that less $sp^2$ bonds and more $sp^3$ bonds are present in the structure of the carbon nanotubes. The hydrogen and carbon atoms form a strong C—H bond with an atomic binding energy of −2.65 eV. The C—C bonds in the carbon nanotubes have a bond length of about 1.54 Å, which is almost equal to that of diamond. The C—C bond remains resistant to external environmental variations or strong electrical current and thus prevents decomposition of the carbon nanotubes.

The carbon nanotubes that are functionalized by hydrogen according to an embodiment of the present invention have semiconductor properties that are essential in their application to nanotransistors. Nanotransistors can be manufactured using the functional hydrogenated carbon nanotubes with an improved yield of almost 100%. Also, the nanotransistors remain operable at high temperature due to the stable C—H chemical bonds.

Figure 4:
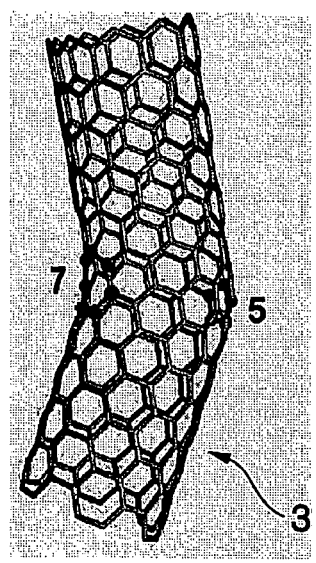
FIG. 4 illustrates the configuration of an intermolecular junction device manufactured using two kinds of carbon nanotubes, according to an embodiment of the present invention.

FIG. 4 illustrates the configuration of an intermolecular junction device 3 manufactured using carbon nanotubes, according to an embodiment of the present invention.

In general, intermolecular junction devices 3 are molecular diode devices manufactured by kinking carbon nanotubes, with one metallic kinked end and the other a semiconductor end. The intermolecular junction device 3 shown in FIG. 4 has a heterogeneous structure of two kinds of carbon nanotubes, wherein carbon nanotubes functionalized by hydrogen according to the present invention may be used for at least one of the carbon nanotubes. The two carbon nanotubes are bound together with different chiral angles at binding sites 5 and 7.

Heterogeneous carbon nanotubes having different energy bandgaps, which can thus be used for diodes, can be manufactured by the hydrogenation of a portion of carbon nanotubes. There is no known method for arbitrarily controlling chiral angles to manufacture such a device as shown in FIG. 4. However, carbon nanotubes having properties required for such a device can be manufactured by partial hydrogenation of arbitrary carbon nanotubes.

Figure 5:
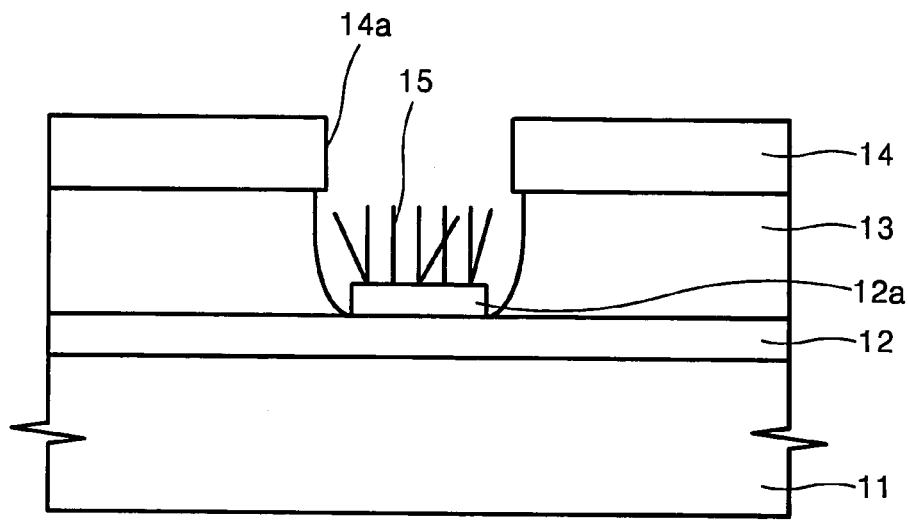
FIG. 5 illustrates a sectional view of a field emitter device using functional hydrogenated carbon nanotubes according to an embodiment of the present invention.

FIG. 5 illustrates a sectional view of a field emitter device using carbon nanotubes according to an embodiment of the present invention. Referring to FIG. 5, a field emitter device according to an embodiment of the present invention includes a source electrode 12 formed as a stripe on a substrate 11, a thin film 12a formed on the source electrode 12 with tips 15 of carbon nanotubes functionalized by hydrogen, a gate dielectric layer 13 formed to surround the tips 15, and a gate electrode 14 formed on the gate dielectric layer 13 with an opening 14a above the tips 15 for electron emission. A drain electrode (not shown) is formed on the gate electrode 14 as a stripe perpendicular to the source electrode 13.

It is preferable that an electron emitter source for the field emitter be manufactured by controlling the electronic energy bandgap of carbon nanotubes for uniform resistance, and be applied uniformly over the entire area of the field emitter for uniform electron emission.

Figure 6:
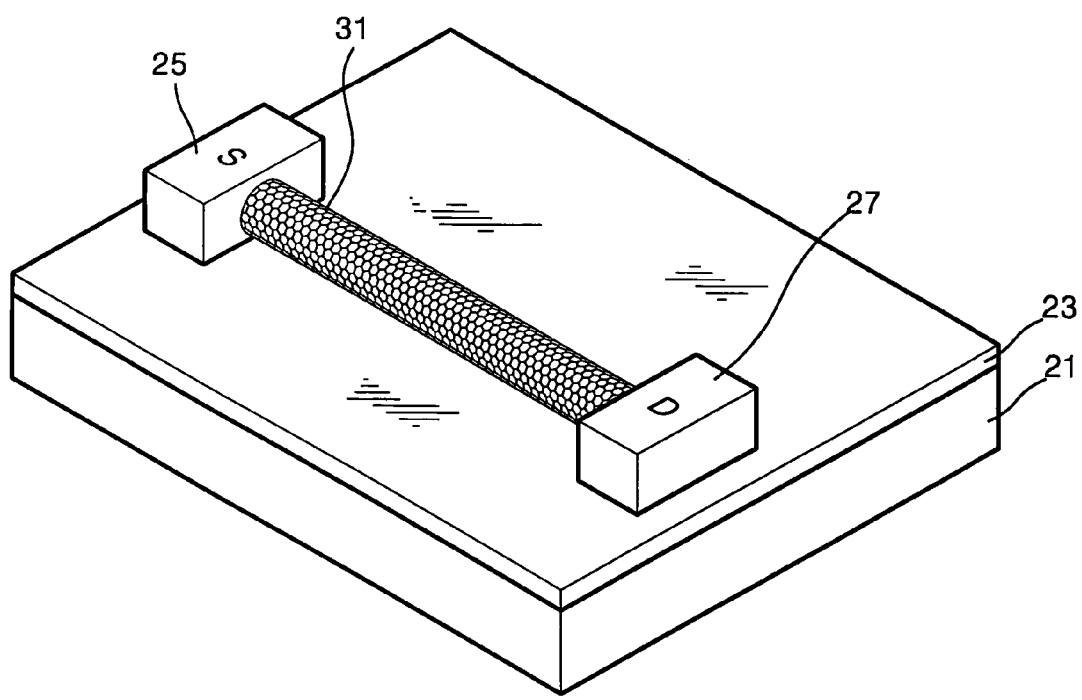
FIG. 6 illustrates a perspective view of a nanotransistor using functional hydrogenated carbon nanotubes according to an embodiment of the present invention.

FIG. 6 illustrates a perspective view of a nanotransistor using carbon nanotubes according to an embodiment of the present invention. Referring to FIG. 6, a nanotransistor using carbon nanotubes according to an embodiment of the present invention includes a substrate 21, an insulating layer 23 formed on the substrate 21, a source region 25 and a drain region 27 formed on the insulating layer 23 with a separation distance therebetween, and a carbon nanotube unit 31 connecting the source region 25 and the drain region 27 as an electron channel.

The carbon nanotube unit 31 in the nanotransistor is formed of a semiconductor carbon nanotube fabricated by hydrogen functionalization according to the present invention. The energy bandgap of the carbon nanotube unit 31 can be controlled within a desired range by varying the duration for which and pressure under which source carbon nanotubes are exposed to hydrogen gas during hydrogenation.

The semiconductor carbon nanotubes according to the embodiment of the present invention can be applied to memory devices, sensors, and other like devices as well as nanotransistors.

In FIG. 6, although the nanotransistor is described as having the source region 25 and the drain region 27 on the substrate 21, the source region 25 and the drain region 27 may also be located in the substrate 21. In this case, the carbon nanotube unit 31 is located in or on the substrate 21 to connect the source region 25 and the drain region 27.

In general, the substrate 21 is a silicon substrate, and the insulating layer 23 on the silicon substrate 21 is formed of silicon oxide. The source region 25 and the drain region 27 may be formed of metal such as titanium, gold, etc. The nanotransistor as described above may be formed using known semiconductor manufacturing processes such as photolithography, etching, oxidation, and thin film deposition.

The semiconductor carbon nanotubes fabricated by hydrogen functionalization according to an embodiment of the present invention can be applied as probe tips for scanning probe microscopy (SPM), as well as the nanodevices illustrated in FIGS. 4 and 6, and further for nanobalances using the resonance of nanotubes, electro-optic devices using the optical properties of carbon nanotubes, various electronic devices, memory devices, chemical sensors using field effect transistors (FETs), and the like.

In addition, the H of the C—H bond on the carbon nanotube wall may be replaced by another substitutent in order for the carbon nanotubes to be used for biochips or biosensors. Alternatively, the carbon nanotubes may be dispersed in a solution to increase their electronegativity and surface area for use as energy devices such as surface capacitors.

Figure 7:
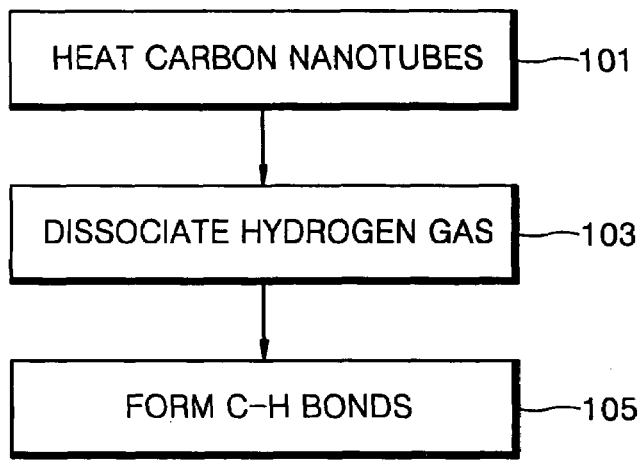
FIG. 7 illustrates a flowchart showing a method for manufacturing functional hydrogenated carbon nanotubes according to an embodiment of the present invention.
Figure 8:
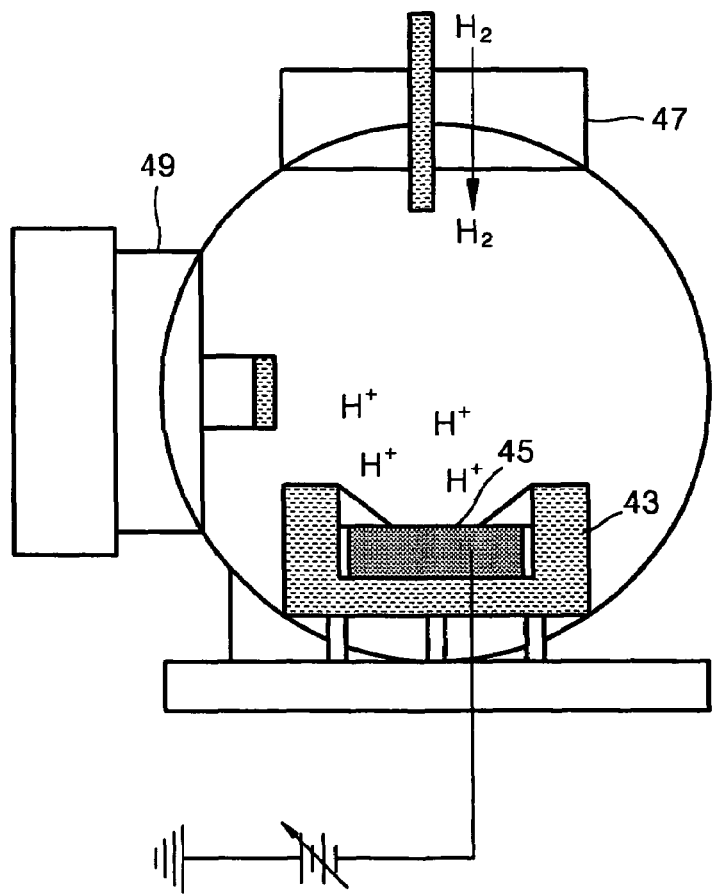
FIG. 8 illustrates an apparatus for carbon nanotube hydrogenation applied in the manufacture of functional hydrogenated carbon nanotubes, according to an embodiment of the present invention.

FIG. 7 illustrates a flowchart showing a method for manufacturing hydrogenated carbon nanotubes according to an embodiment of the present invention. FIG. 8 illustrates an apparatus for conducting carbon nanotube hydrogenation.

Initially, a substrate 45 with carbon nanotube powder or individual carbon nanotubes thereon is heated in a vacuum container 43 at $10^{-6}$ torr or less and above 100° C. for 2 hours or longer, to remove gas adsorbed on the walls of the carbon nanotubes (step 101). With a tungsten filament 49 disposed near the top entrance of the vacuum container, which is heated to a temperature of 1500° C. or greater by an electric current, a RF or DC bias voltage is applied to hydrogen gas in molecular form supplied through an inlet 47, or an arc discharge is induced to dissociate the molecular hydrogen gas into hydrogen atoms (step 103). The dissociated hydrogen atoms contact and are adsorbed into the walls of the carbon nanotubes to form C—H chemical bonds (step 105). At this time, the temperature of the substrate 45 is maintained at 100° C. or less.

The duration for which the carbon nanotubes are exposed to the hydrogen gas is controlled within a range of from 1 hour to 20 hours, and the pressure of the hydrogen gas in the vacuum container is controlled within a range from $10^{-6}$ torr to $10^{-3}$ torr, such that metallic carbon nanotubes are converted into semiconductor nanotubes or narrow energy bandgap semiconductor carbon nanotubes are converted into wide energy bandgap semiconductor carbon nanotubes.

Figure 9A:
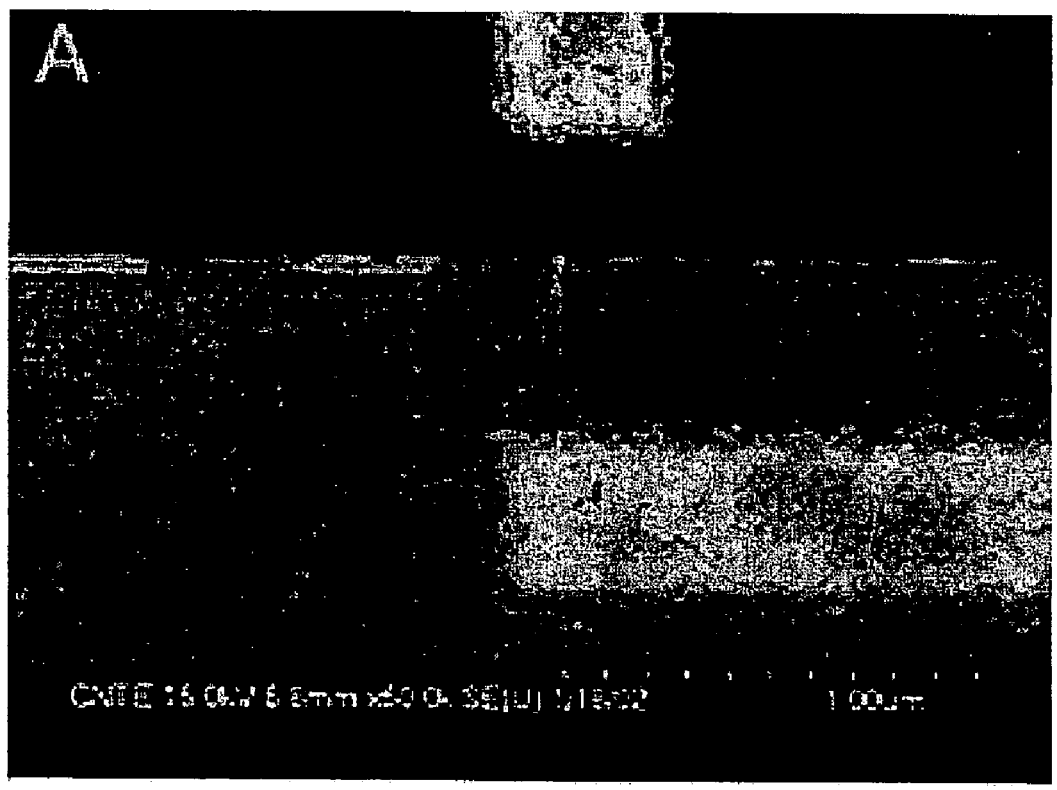
FIG. 9A is a scanning electron microscopic (SEM) photograph showing the hydrogenation of carbon nanotubes to form hydrogenated semiconductor carbon nanotubes according to the present invention.

FIG. 9A is a scanning electron microscopic (SEM) image showing the hydrogenation of carbon nanotubes to form C—H bonds in the manufacture of semiconductor carbon nanotubes by hydrogenation according to an embodiment of the present invention. Initially, the carbon nanotubes are bound to the silicon substrate by metal using electron-beam lithography, wherein half of a carbon nanotube is buried in a silicon oxide ($SiO_2$) layer having a thickness of 100 nm while the other half is exposed to the hydrogen gas, as shown in FIG. 9A. Next, a vacuum atmosphere is created by degassing at 300° C. for 6 hours, and the carbon nanotubes are hydrogenated by being exposed to the hydrogen gas at a temperature of 100° C. and a pressure of $10^{-5}$ torr for several hours.

Hydrogen atoms in the hydrogen gas permeate into the carbon nanotubes exposed on the surface of the silicon oxide layer to bind to carbon atoms, so that functional hydrogenated carbon nanotubes are formed. In the photograph of FIG. 9A, the atoms of the carbon nanotube are carbon atoms, and the smaller atoms on the external wall of the carbon nanotube are hydrogen atoms.

Figure 1:
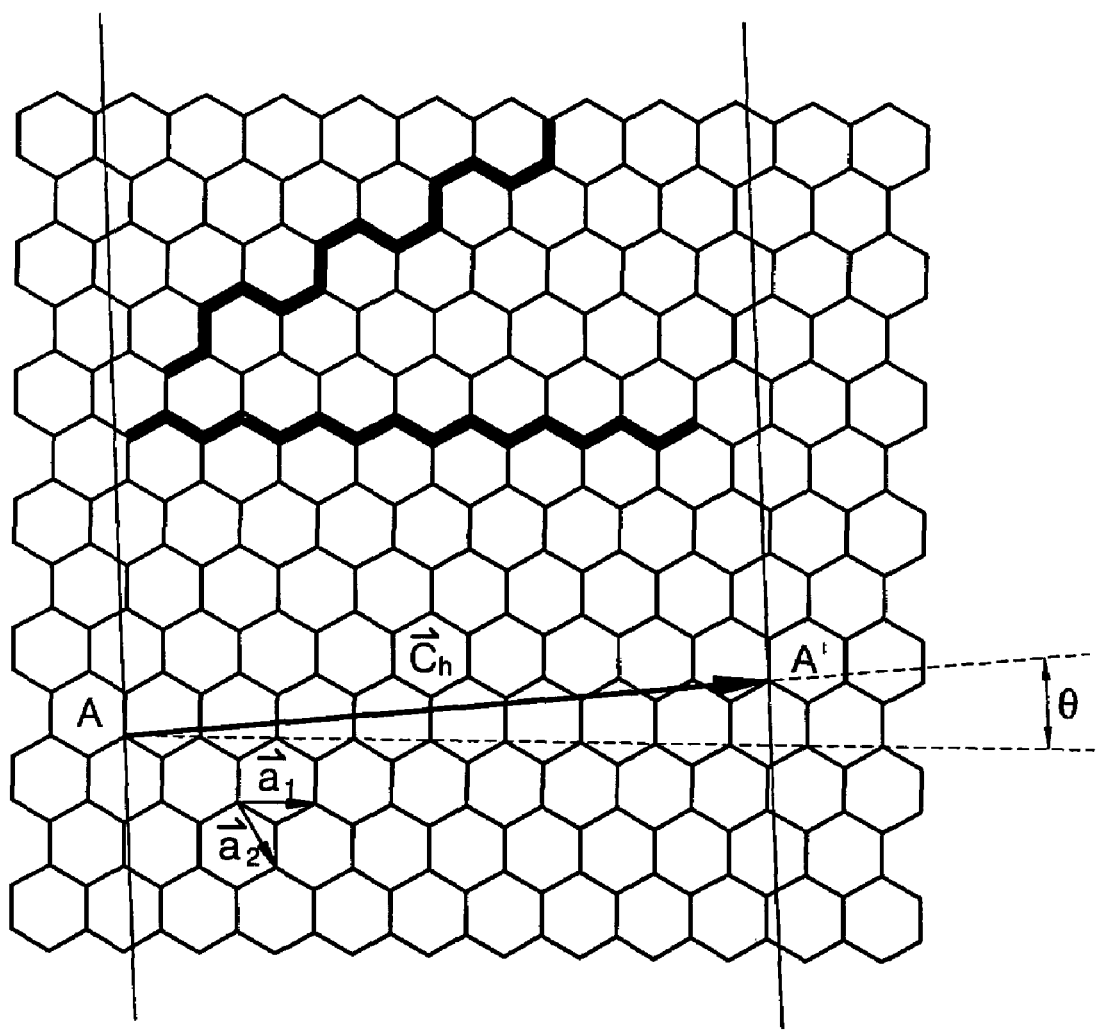
FIG. 1 illustrates a configuration of a conventional carbon nanotube.
Figure 2A:
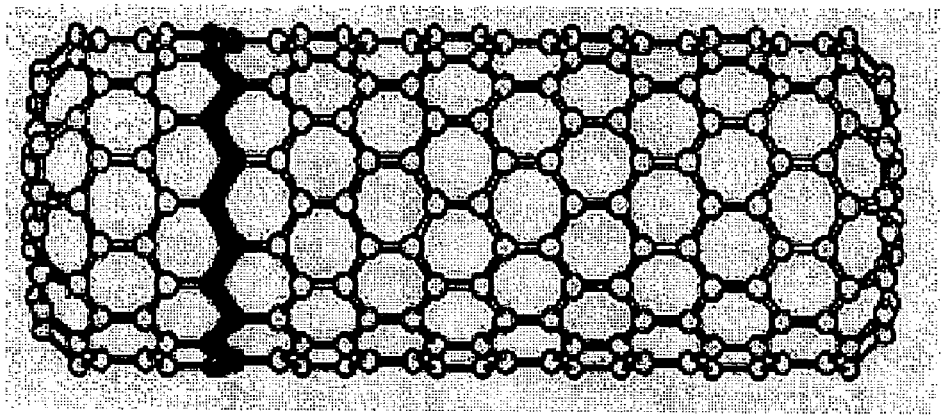
FIG. 2A illustrates a zigzag configuration of a carbon nanotube.
Figure 2B:
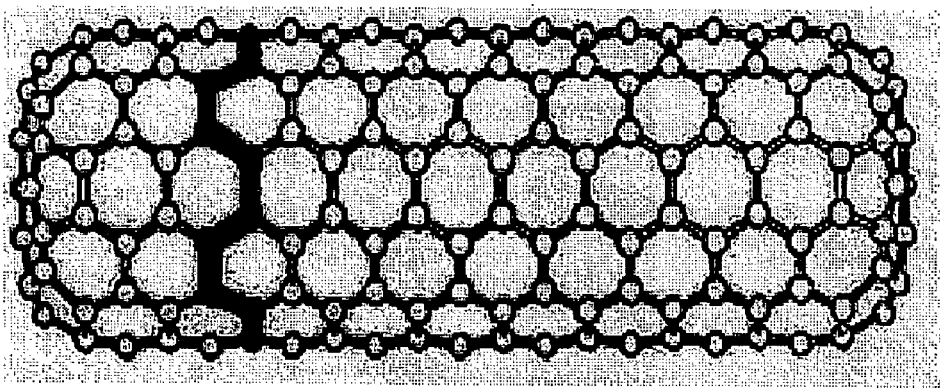
FIG. 2B illustrates an armchair configuration of a carbon nanotube.
Figures 1, 9B:
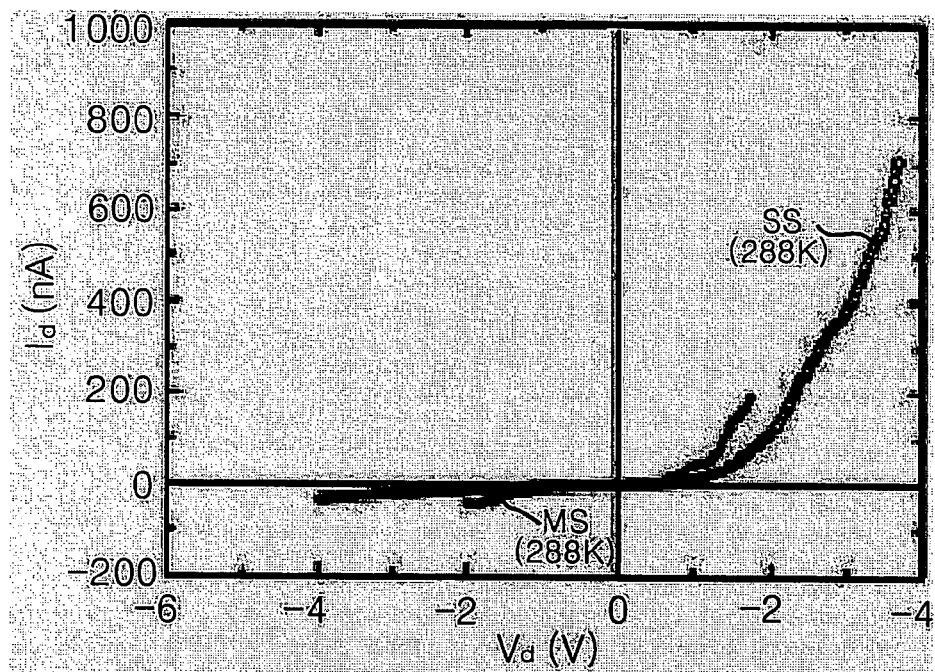
Figures 2, 9B:
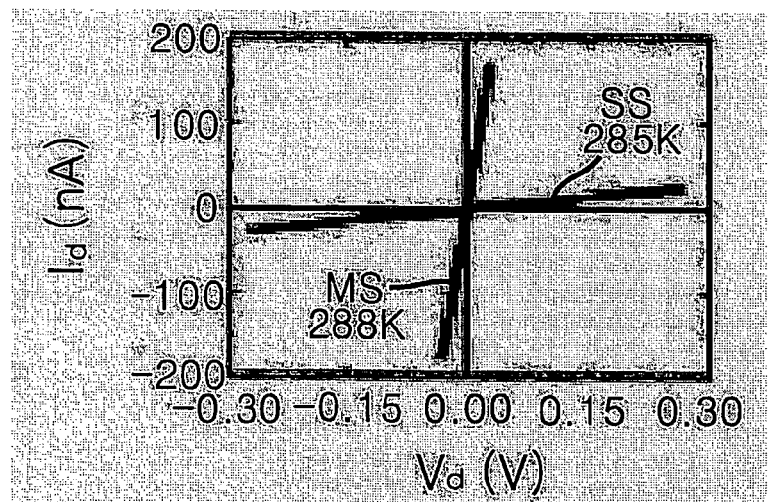

FIG. 9B-2 is a graph of current versus voltage for pristine samples (denoted as "MS") and semiconducting samples (denoted as "SS") having an energy bandgap of 0.8 eV before hydrogenation, and FIG. 9B-1 is a graph of current versus voltage for the MS and SS after hydrogenation.

As is apparent from the insert of FIG. 9B-2, the pristine samples have metallic properties at room temperature, and the MS and SS have resistances of 155 kΩ and 10 MΩ, respectively. However, as is apparent from FIG. 9B-1, the MS and SS are converted, by hydrogenation, into semiconductor carbon nanotubes with a wide energy bandgap, with a rectifying effect at an ambient temperature that is greater in the SS than in the MS. The anisotropy, which can be defined as $\alpha=|I(V_d=2V)/I(V_d=-2V)|$, is 5 and 10 for the respective MS and SS samples, i.e., the rectifying effect is more prominent in the SS sample.

Figures 1, 9C:
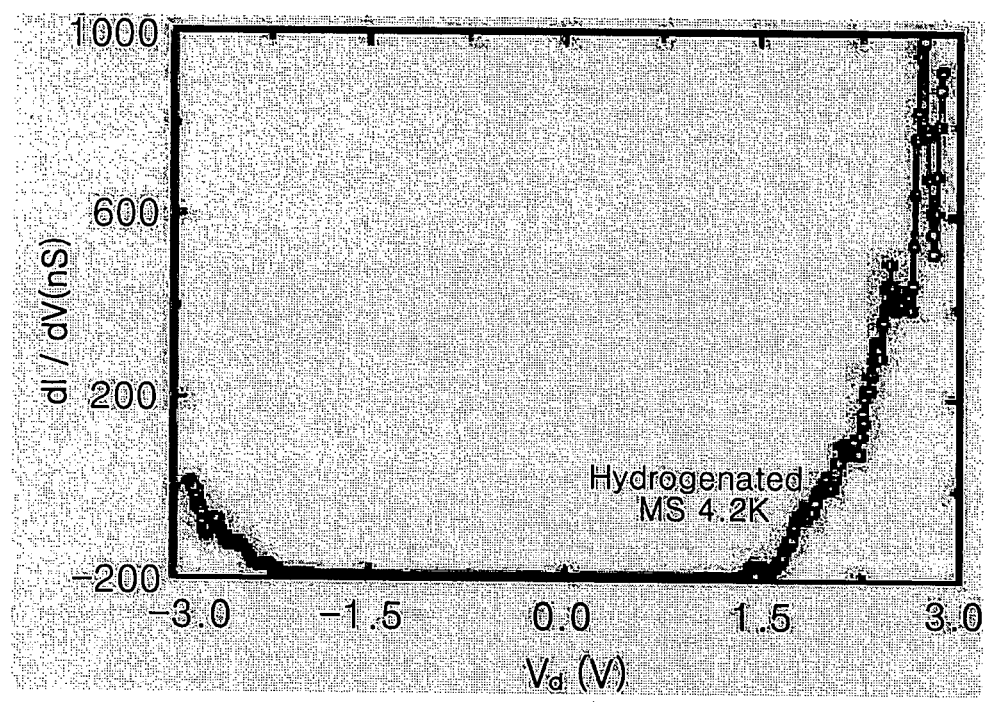
Figures 2, 9C:
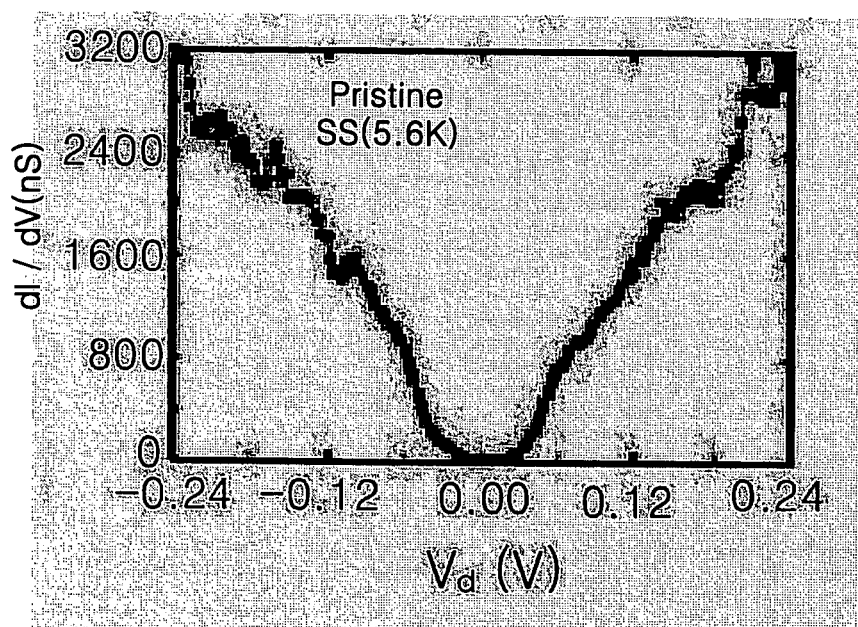

FIG. 9C-2 is a graph illustrating a curve for the pristine MS sample showing differential conductance (dI/dV) at 5.6K with respect to drain voltage before hydrogenation, and FIG. 9C-1 is a graph illustrating a curve for the MS showing differential conductance (dI/dV) at 4.2K with respect to drain voltage after hydrogenation. As shown in FIG. 9C-2, the MS before hydrogenation has a value (dI/dV) of differential conductance at a zero-drain voltage, i.e., in a zero bias region, at 5.6K, which indicates that the MS has conductance and is nearly metallic. The graph of FIG. 9C illustrates that the MS becomes semiconductive with a widened energy bandgap of about 1.88 eV after hydrogenation and that the conductance of the MS linearly increases beyond the energy bandgap region.

Figures 1, 9D:
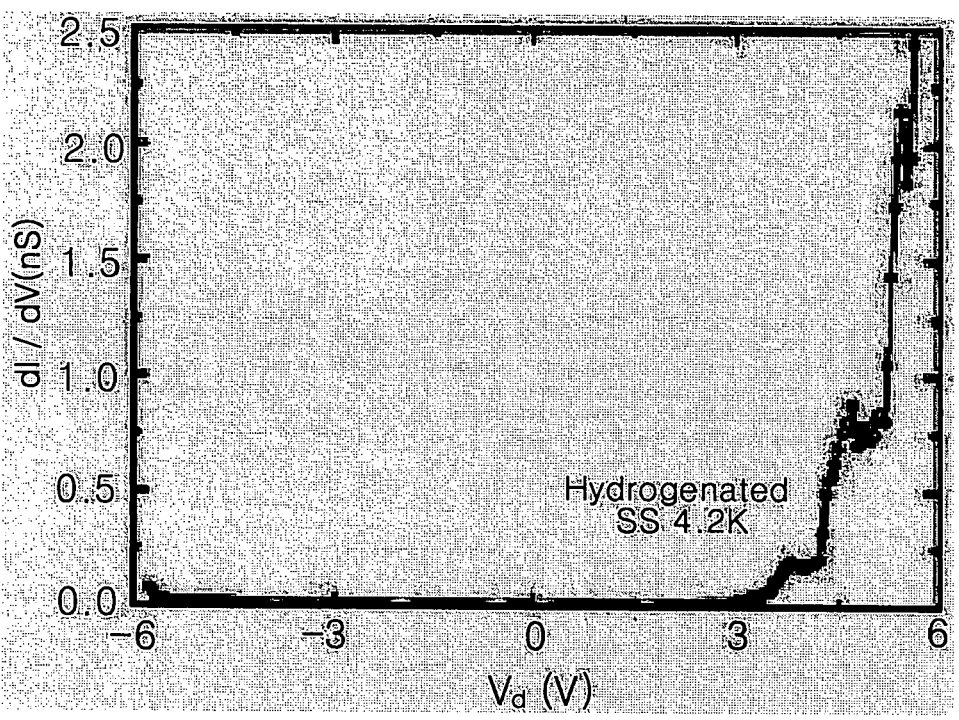
Figures 2, 9D:
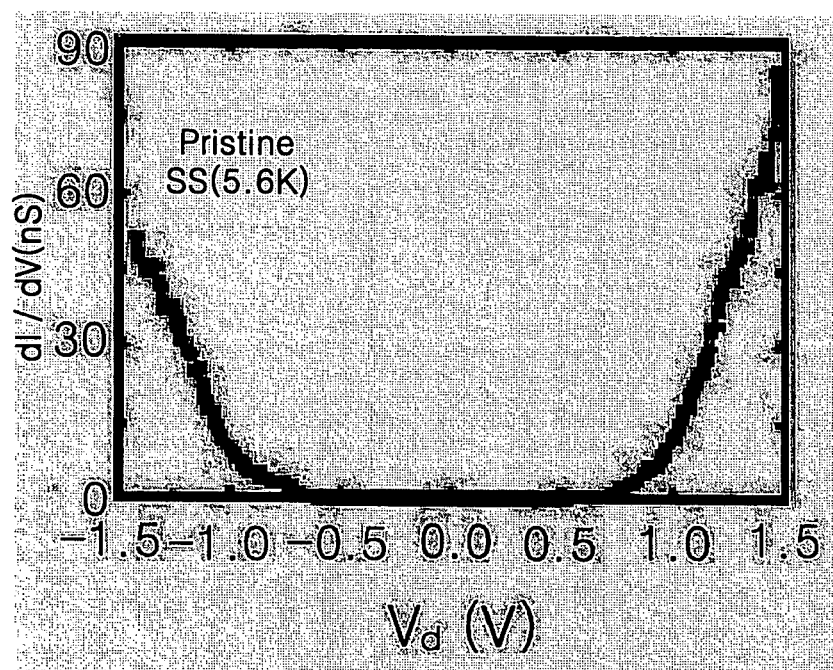

FIG. 9D-2 is a graph illustrating a curve for the pristine SS sample showing differential conductance (dI/dV) at 5.6K with respect to drain voltage before hydrogenation, and FIG. 9D-1 is a graph illustrating a curve for the SS sample showing differential conductance at 4.2K with respect to drain voltage after hydrogenation. As shown in FIG. 9D-2, the SS before hydrogenation has semiconductor properties with an energy bandgap of about 0.8 eV. The graph illustrated in FIG. 9D-1 shows that the SS after hydrogenation has improved semiconductor properties with a widened energy bandgap of about 4.4 eV.

Figure 10:
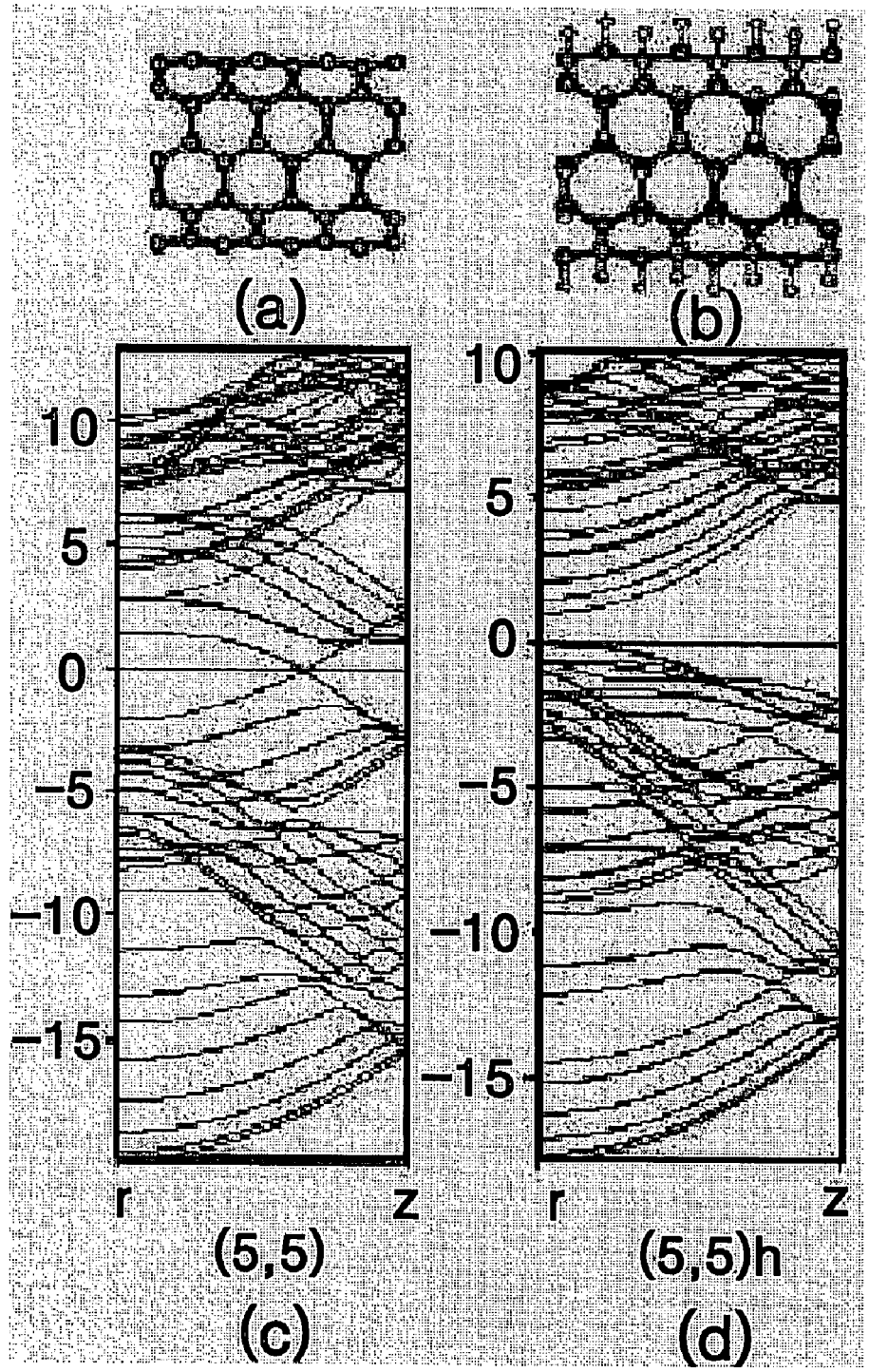
FIGS. 10A through 10D illustrate the conversion of MS into SS by hydrogenation according to the present invention, and in particular.

FIGS. 10A through 10D illustrate the conversion of metallic carbon nanotubes into semiconducting carbon nanotubes by hydrogenation according to the present invention, in which changes in configuration and energy bandgap before and after hydrogenation are shown. FIG. 10A shows the configuration of a (5,5) armchair metallic sample, FIG. 10B shows the configuration of a (5,5)h semiconducting sample hydrogenated from the (5,5) armchair metallic sample, FIG. 10C shows the energy level of the (5,5) metallic sample shown in FIG. 10A, and FIG. 10D shows the energy level of the (5,5)h semiconducting sample shown in FIG. 10B. The (5,5) metallic sample was converted into the semiconducting sample shown in FIG. 10B having an energy bandgap of 1.63 eV after hydrogenation.

Figure 11:
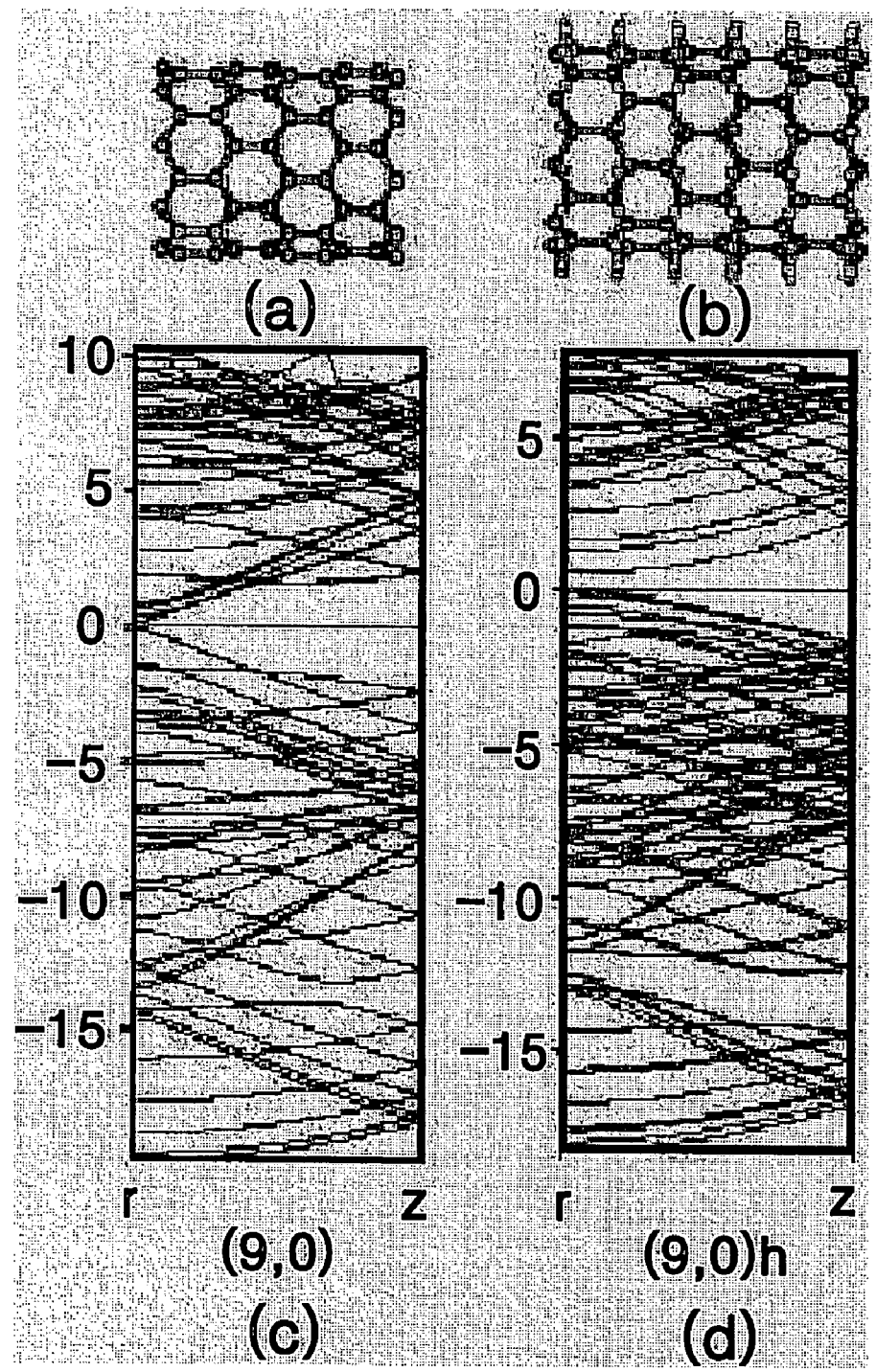
FIGS. 11A through 11D illustrate the conversion of SS having a narrow energy bandgap into SS having a wide energy bandgap by hydrogenation according to the present invention, and in particular.

FIGS. 11A through 11D illustrate the conversion of a (9,0) zigzag semiconducting sample having a narrow energy bandgap into a (9,0)h semiconducting sample having a wide energy bandgap by hydrogenation according to the present invention, in which changes in configuration and energy bandgap before and after hydrogenation are shown. FIG. 11A shows the configuration of a (9,0) semiconducting sample, FIG. 11B shows the configuration of a (9,0)h semiconducting sample, FIG. 11C shows the energy level of the (9,0) semiconducting sample shown in FIG. 11A having a zero energy bandgap, and FIG. 11D shows the energy level of the (9,0)h semiconductor carbon nanotube shown in FIG. 11B having a relatively wide energy bandgap. The energy bandgap of the (9,0) semiconductor carbon nanotube, which has zero energy bandgap, was widened to 2.63 eV in the (9,0)h semiconducting sample after hydrogenation.

Figure 12A:
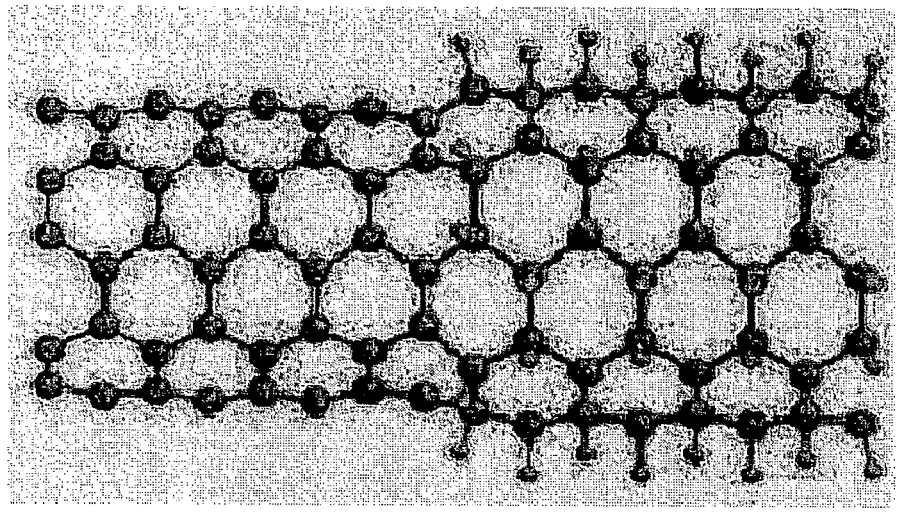
FIG. 12A illustrates a configuration of a heterogeneous junction between an MS and a functional hydrogenated SS, according to an embodiment of the present invention.
Figure 13A:
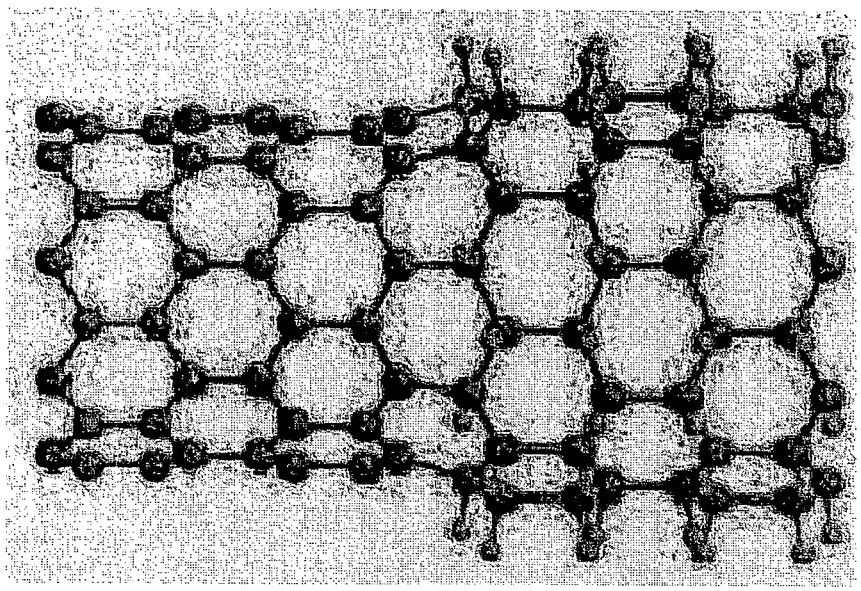
FIG. 13A illustrates a configuration of a heterogeneous junction between a general SS and a functional hydrogenated SS, according to an embodiment of the present invention.

FIGS. 12A and 13A illustrate configurations of intermolecular junctions between general carbon nanotubes and hydrogenated carbon nanotubes according to an embodiment of the present invention. The length of C—CH bonds is 1.48 Å. However, the length of all other bonds from the second layer at the interface layer on both sides is closer to the length of individual tubes. Carbon atoms of the metallic carbon nanotube located at the hydrogenated carbon nanotube side accept extra charges from the adsorbed hydrogen atoms of the hydrogenated carbon nanotube, rather than from carbon atoms at the metallic CNT side, so that more charges accumulate at the interface layer closer to the metallic carbon nanotube than the semiconductor hydrogenated carbon nanotube. Accordingly, a small degree of band-bending is highly likely to occur in the MS junction, whereas the degree of band-bending in the SS junction is negligible.

Figure 12B:
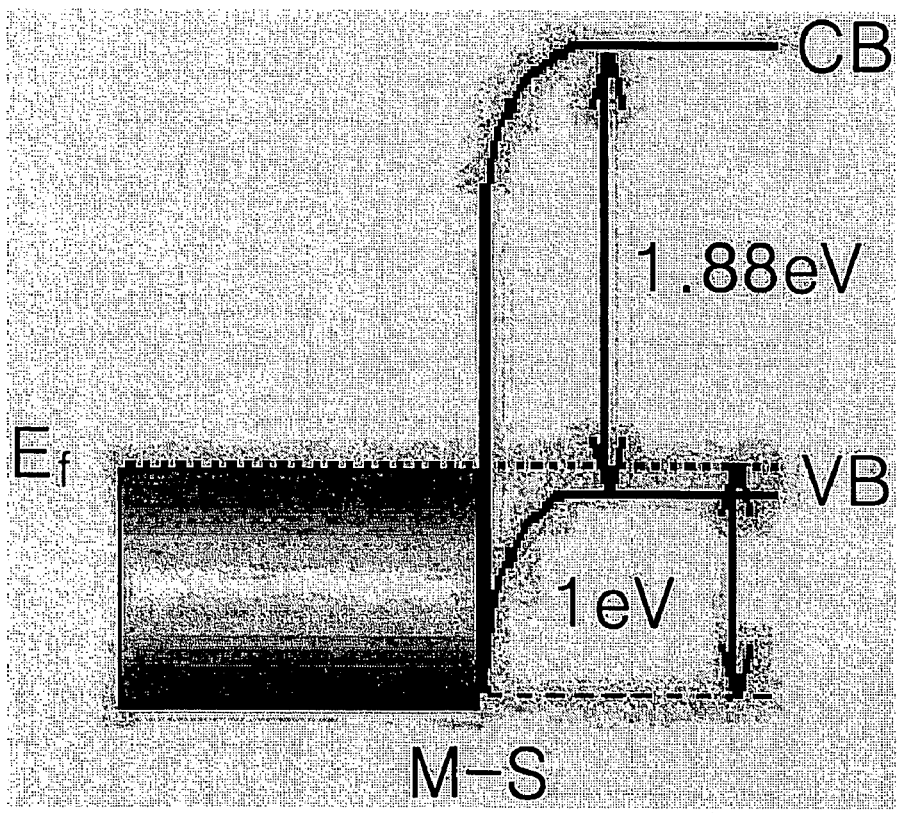
FIG. 12B is a diagram showing the height and energy bandgap of a M-S Schottky junction barrier between the MS and the SS shown FIG. 12A.
Figure 13B:
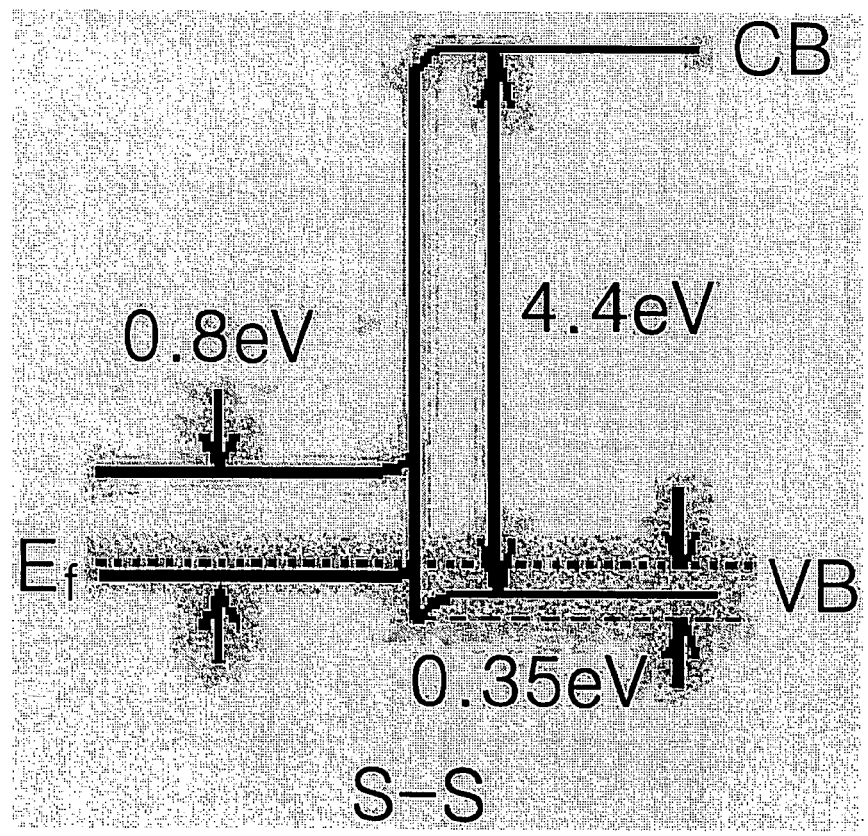
FIG. 13B is a diagram showing the height and energy bandgap of an S-S Schottky junction barrier between the two SSs shown in FIG. 13A.

FIGS. 12B and 13B are diagrams showing the height and energy bandgap of a M-S Schottky junction barrier formed by connecting the MS and the SS, and the height and energy bandgap of an S-S Schottky junction barrier formed by connecting two SSs, respectively.

In general, the height of a Shottky junction barrier is mainly determined by the charges in a neutral condition, and the migration of charges relies on the difference in electronegativity between a metal and a semiconductor. Most semiconductors do not simply comply with the Shottky model, and thus it is desirable to refer to a junction band diagram to understand the properties of semiconductors. FIGS. 12B and 13B are junction band diagrams for the M-S and S-S junctions, respectively, where the junction barrier height is equal to the energy band offset.

Referring to FIG. 12B, the energy bandgap between a valence band (VB) and a conduction band (CB) in a semiconductor carbon nanotube region reaches 1.88 eV, and there is a relatively low energy barrier between the metallic carbon nanotube (MS) and the SS.

Referring to FIG. 13B, which is for the case where a semiconductor carbon nanotube (SS) having a relatively wide energy bandgap of 4.4 eV is connected with a semiconductor carbon nanotube (SS) having a narrow energy bandgap of 0.8 eV, apparently, the energy bandgap becomes wide with an energy barrier of 3.6 eV between the two SSs.

The M-S and S-S junctions are hole-doped, and an abrupt junction occurs in the interface region of one or two monolayers. In the M-S junction, charges may transfer from the MS sample to the SS sample, thereby inducing a sharp band-bending in the region of semiconductor carbon nanotubes. Although the migration of charges in the S-S junction is negligible, the charge transfer in the S-S junction may cause a spike.

Figure 14A:
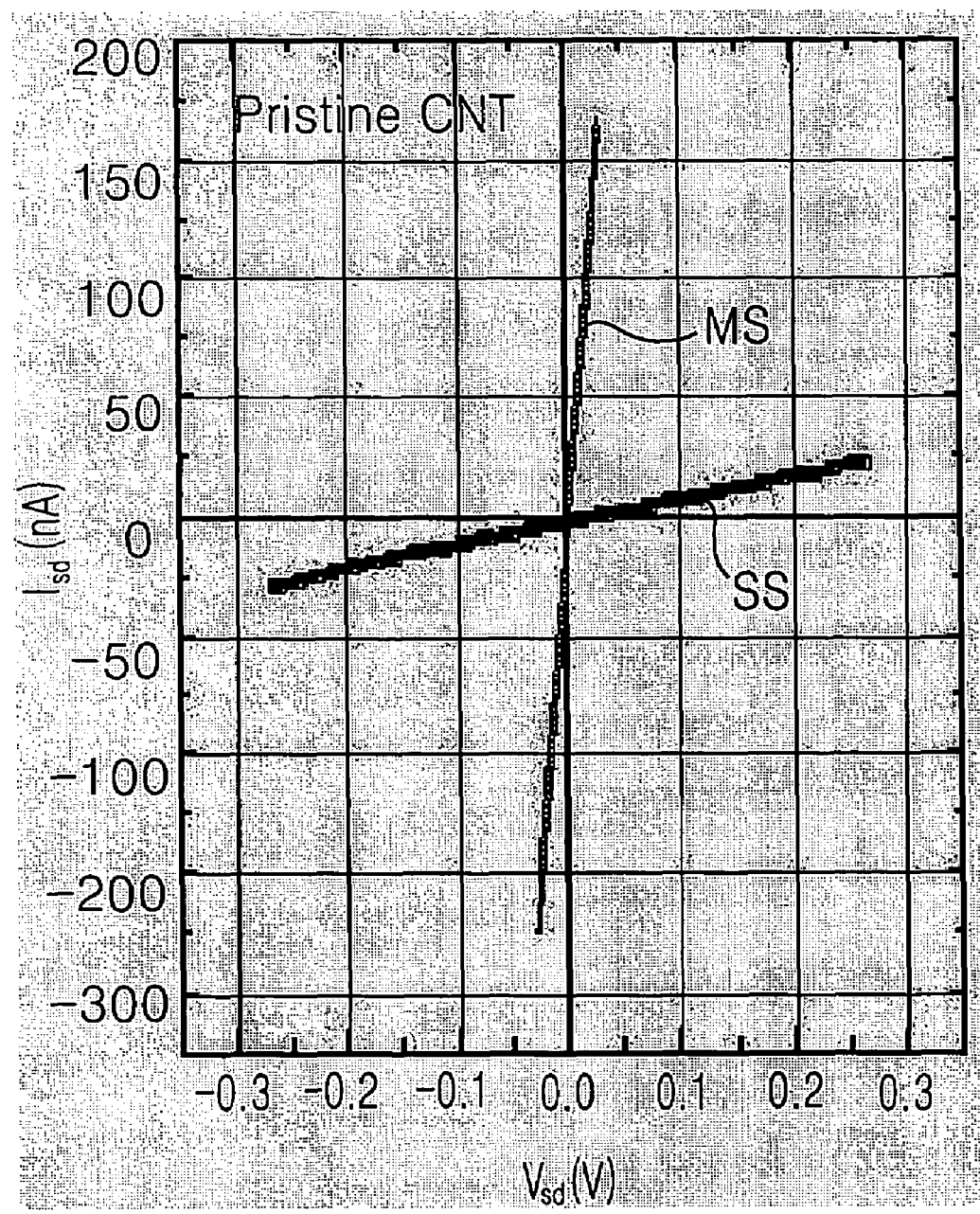
FIG. 14A is a graph plotting a curve of current versus voltage for metallic and semiconductor carbon nanotubes having a narrow bandgap before hydrogenation.
Figures 1, 14B:
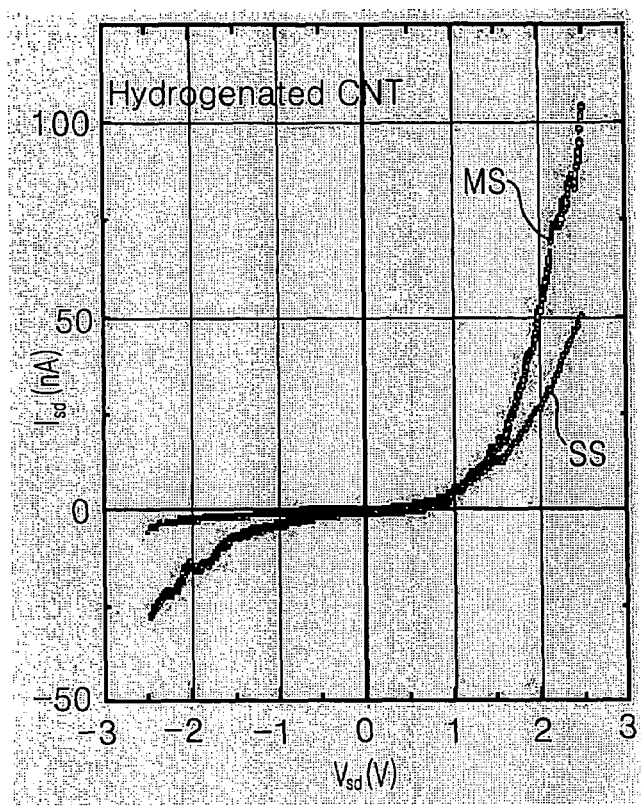
Figures 2, 14B:
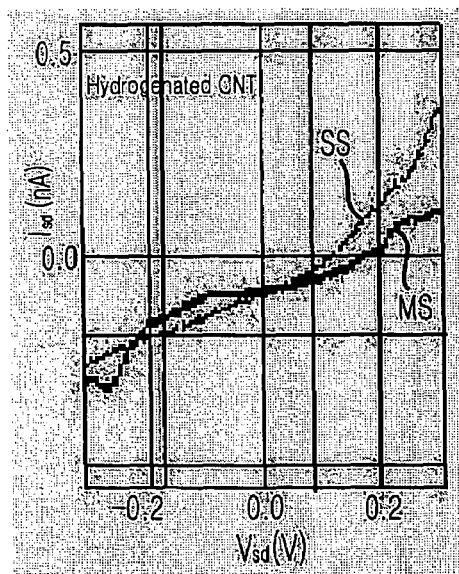

FIGS. 14A and 14B are graphs of current versus voltage for carbon nanotubes MS and SS before and after hydrogenation, respectively. Referring to FIG. 14A, before hydrogenation, both a pristine MS and a pristine SS having a narrow energy bandgap show a linear, proportional current-to-voltage relation which indicates that the pristine MS and SS have metallic properties and a metal-like nature, respectively.

However, after hydrogenation, the MS and the SS having the narrow energy bandgap have a rectifying effect like semiconductors having a large energy bandgap.

Figure 15A:
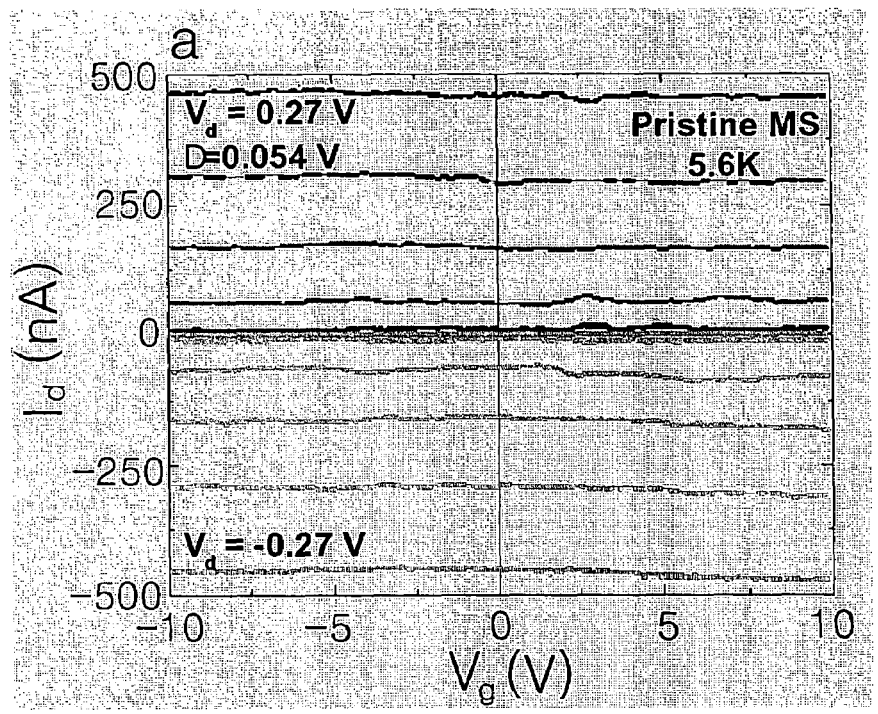
FIGS. 15A and 15B are graphs plotting a curve of current versus voltage for field effect transistors (FETs) using non-hydrogenated and hydrogenated SSs, respectively, according to an embodiment of the present invention.
Figure 15B:
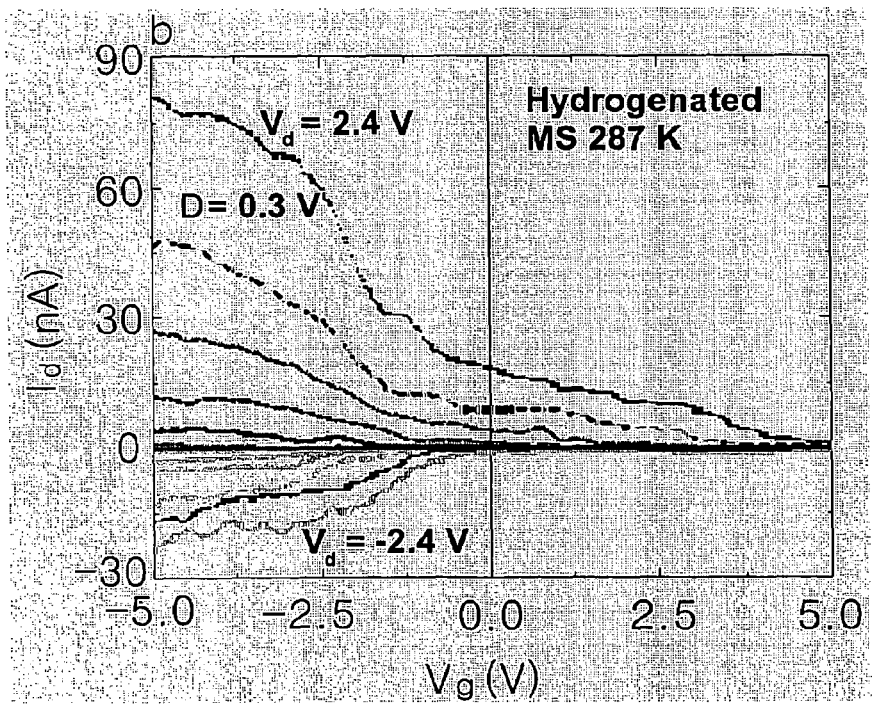

FIGS. 15A and 15B show graphs of current versus voltage before and after hydrogenation, respectively, in field effect transistors (FETs). In particular, FIG. 15A is a graph of source-drain current $I_d$ at 5.6K with respect to gate voltage $V_g$ in a FET having an electron channel formed using a non-hydrogenated metallic carbon nanotube (MC). As shown in FIG. 15A, the source-drain current $I_d$ is about −500 nA at a drain voltage $V_d$ of −0.27V and about 500 nA at a drain voltage $V_d$ of 0.27V. The source-drain current $I_d$ of the FET is constant regardless of gate voltage ($V_g$) variations. This means that the FET operates inappropriately as a transistor and that the MC acts merely as a metallic tube in the FET.

FIG. 15B is a graph of source-drain current $I_d$ at 287K with respect to gate voltage $V_g$ in a FET formed using hydrogenated multi-wall carbon nanotubes. As shown in FIG. 15B, when the drain voltage is positive, i.e., when a positive bias voltage is applied to the hydrogenated carbon nanotubes, a large current flows across the transistor. When the drain voltage is negative, current is suppressed, and a rectifying effect appears. In a range of drain voltage $V_d$ from −2.4V to 2.4V, the source-drain current $I_d$ increases as the gate voltage $V_g$ increases. Therefore, the FET properly and stably operates as a transistor at an ambient temperature, irrespective of temperature variations. These results provide support that an asymmetric metal-semiconductor (MS) junction has been formed between the hydrogenated carbon nanotubes and non-hydrogenated metallic carbon nanotubes in the FET.

Figure 16A:
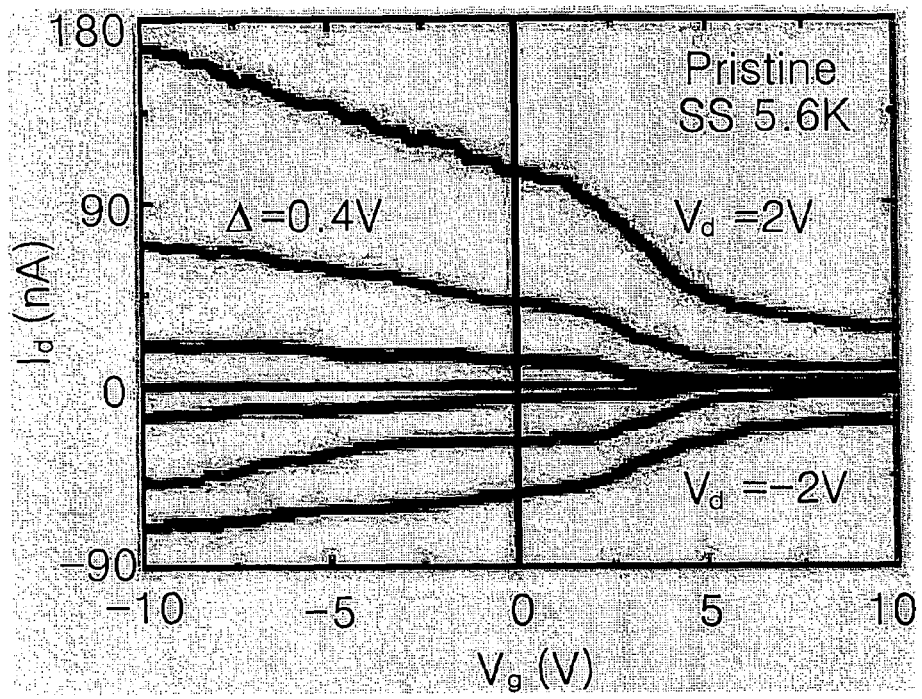
FIG. 16A is a graph plotting a curve of drain current versus gate voltage at a predetermined drain voltage for semiconductor carbon nanotubes (SS) before hydrogenation.

FIG. 16A illustrates a graph of drain current versus gate voltage at a predetermined drain voltage for the pristine SS sample before hydrogenation. Referring to FIG. 16A, the non-hydrogenated semiconductor carbon nanotubes show semiconductor properties with a gate effect at low temperature. The flow of a limited amount of current at a zero gate voltage means that the carbon nanotubes are already hole-doped, and the small anisotropy in current at drain voltages of different polarities means that the carbon nanotubes and a metal electrode are in asymmetrical contact.

Figure 16B:
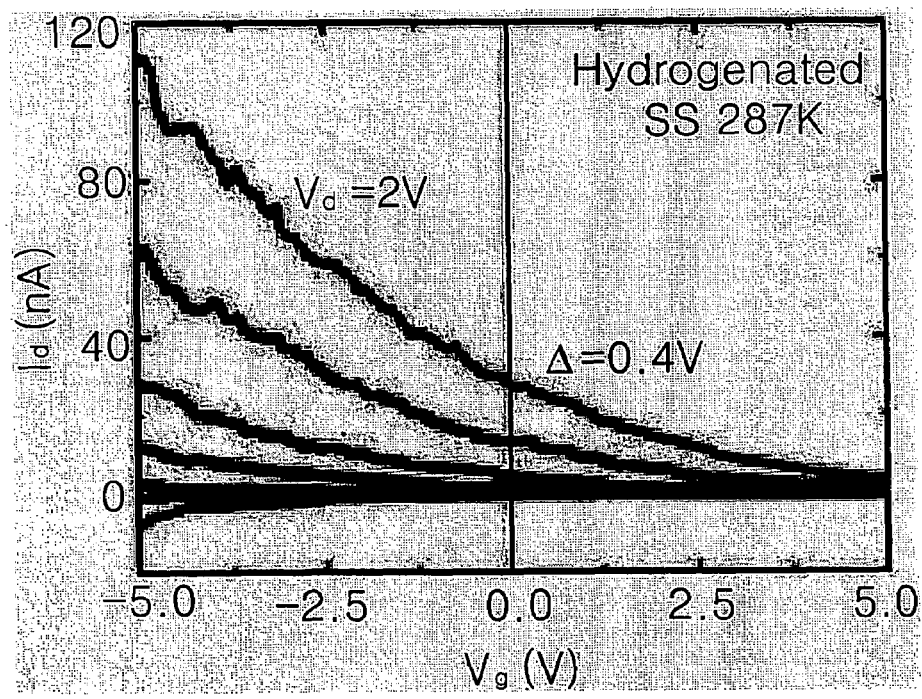
FIG. 16B is a graph plotting a curve of drain current versus gate voltage at a predetermined drain voltage for the semiconductor carbon nanotubes (SS) after hydrogenation.

FIG. 16B illustrates a graph of source-drain current versus gate voltage at a predetermined drain voltage for the SS sample after hydrogenation. Referring to FIG. 16B, after hydrogenation, the SS sample has a large energy bandgap, thereby providing an about 10 times greater rectifying effect than before hydrogenation. It can be expected from this result that an S-S junction between the narrow-bandgap and wide-bandgap semiconductor nanotubes has been formed in the SS sample by hydrogenation.

As shown in FIGS. 12B and 13B, the junction barrier height after hydrogenation is greater in the metallic carbon nanotube at 1 eV than in the semiconductor carbon nanotube at 0.35 eV.

In carbon nanotubes functionalized by hydrogen and a method for fabricating the functional hydrogenated carbon nanotubes according to the present invention, the energy bandgap of the carbon nanotubes can be easily controlled by varying the duration and temperature of hydrogenation, so that the conversion of metallic carbon nanotubes into semiconductor carbon nanotubes and of semiconductor carbon nanotubes having a relatively narrow energy bandgap into semiconductor carbon nanotubes having a relatively wide energy bandgap can be achieved. Such hydrogenated carbon nanotubes according to the present invention have a wide range of applications including, for example, use in various electronic devices, optoelectronic devices, energy storage devices, and the like, and particularly, can be used for nanotransistors workable at high temperature because the hydrogenated carbon nanotubes according to the present invention have stable C—H and C—C chemical bonds.

Preferred embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A method for fabricating semiconductor carbon nanotubes, the method comprising:
   heating carbon nanotubes in a vacuum;
   dissociating hydrogen molecules in hydrogen gas into hydrogen atoms; and
   exposing the carbon nanotubes to the hydrogen gas to form chemical bonds between carbon atoms of the carbon nanotubes and the hydrogen atoms, wherein the chemical bonds between the carbon and hydrogen atoms are $sp^3$ hybrid bonds.

2. The method as claimed in claim 1, wherein heating the carbon nanotubes in a vacuum is performed at a temperature of 100° C. or greater.

3. The method as claimed in claim 2, wherein heating the carbon nanotubes in a vacuum is performed for 2 hours or longer.

4. The method as claimed in claim 1, wherein dissociating the hydrogen molecules into the hydrogen atoms is performed by heating at a temperature of 1500° C. or greater.

5. The method as claimed in claim 4, wherein dissociating the hydrogen molecules into the hydrogen atoms is performed by applying an RF or DC bias voltage.

6. The method as claimed in claim 4, wherein dissociating the hydrogen molecules into the hydrogen atoms is performed using arc discharging.

7. The method claimed in claim 5, wherein in forming the chemical bonds, the energy bandgap of the carbon nanotubes is controlled by varying a duration for which the carbon nanotubes are exposed to the hydrogen gas.

8. The method as claimed in claim 6, wherein in forming the chemical bonds, the energy bandgap of the carbon nanotubes is controlled by varying a duration for which the carbon nanotubes are exposed to the hydrogen gas.

9. The method as claimed in claim 5, wherein in forming the chemical bonds, the energy bandgap of the carbon nanotubes is controlled by varying a level of the vacuum.

10. The method as claimed in claim 6, wherein in forming the chemical bonds, the energy bandgap of the carbon nanotubes is controlled by varying a level of the vacuum.

11. A method for fabricating semiconductor carbon nanotubes, the method comprising:
    heating carbon nanotubes in a vacuum;
    dissociating hydrogen molecules in hydrogen gas into hydrogen atoms; and
    exposing the carbon nanotubes to the hydrogen gas to form chemical bonds between carbon atoms of the carbon nanotubes and the hydrogen atoms,
    wherein the semiconductor carbon nanotubes form parts of heterogeneous carbon nanotubes having a first nanotube portion and a second nanotube portion covalently bonded together, and
    wherein exposing the carbon nanotubes to the hydrogen gas includes exposing the first nanotube portion without exposing the second nanotube portion.

12. The method as claimed in claim 11, further comprising, prior to the heating, burying the second nanotube portion in an insulating layer so as to isolate the second nanotube portion from the hydrogen gas.

13. The method as claimed in claim 12, wherein the insulating layer is a silicon oxide layer.

14. The method as claimed in claim 1, wherein in forming the chemical bonds, the energy bandgap of the carbon nanotubes is controlled by varying a duration for which the carbon nanotubes are exposed to the hydrogen gas.

15. The method as claimed in claim 1, wherein in forming the chemical bonds, the energy bandgap of the carbon nanotubes is controlled by varying a level of the vacuum.

16. The method as claimed in claim 7, wherein the duration is from about 1 hour to about 20 hours.

17. The method as claimed in claim 8, wherein the duration is from about 1 hour to about 20 hours.

18. The method as claimed in claim 9, wherein the level of the vacuum is from about $10^{-3}$ torr to about $10^{-6}$ torr.

19. The method as claimed in claim 10, wherein the level of the vacuum is from about $10^{-3}$ torr to about $10^{-6}$ torr.

20. The method as claimed in claim 1, wherein the semiconductor carbon nanotubes form parts of heterogeneous carbon nanotubes having a first nanotube portion and a second nanotube portion covalently bonded together, and
    wherein exposing the carbon nanotubes to the hydrogen gas includes exposing the first nanotube portion without exposing the second nanotube portion.

21. The method as claimed in claim 20, further comprising, prior to the heating, burying the second nanotube portion in an insulating layer so as to isolate the second nanotube portion from the hydrogen gas.

22. The method as claimed in claim 1, further comprising, after forming the chemical bonds between the carbon atoms of the carbon nanotubes and the hydrogen atoms, replacing the chemically-bonded hydrogen atoms with another substituent.

23. The method as claimed in claim 11, wherein the chemical bonds between the carbon and hydrogen atoms are $sp^3$ hybrid bonds.

24. The method as claimed in claim 11, wherein in forming the chemical bonds, the energy bandgap of the carbon nanotubes is controlled by varying a duration for which the carbon nanotubes are exposed to the hydrogen gas.

25. The method as claimed in claim 11, wherein in forming the chemical bonds, the energy bandgap of the carbon nanotubes is controlled by varying a level of the vacuum.

26. The method as claimed in claim 11, further comprising, after forming the chemical bonds between the carbon atoms of the carbon nanotubes and the hydrogen atoms, replacing the chemically-bonded hydrogen atoms with another substituent.

27. A method for fabricating semiconductor carbon nanotubes, the method comprising:
    heating carbon nanotubes in a vacuum;
    dissociating hydrogen molecules in hydrogen gas into hydrogen atoms; and
    exposing the carbon nanotubes to the hydrogen gas to form chemical bonds between carbon atoms of the carbon nanotubes and the hydrogen atoms, wherein in forming the chemical bonds, the energy bandgap of the carbon nanotubes is controlled by varying a duration for which the carbon nanotubes are exposed to the hydrogen gas.

28. A method for fabricating semiconductor carbon nanotubes, the method comprising:
    heating carbon nanotubes in a vacuum;
    dissociating hydrogen molecules in hydrogen gas into hydrogen atoms; and
    exposing the carbon nanotubes to the hydrogen gas to form chemical bonds between carbon atoms of the carbon nanotubes and the hydrogen atoms, wherein in forming the chemical bonds, the energy bandgap of the carbon nanotubes is controlled by varying a level of the vacuum.

* * * * *